US006388602B1

(12) United States Patent
Yang

(10) Patent No.: US 6,388,602 B1
(45) Date of Patent: May 14, 2002

(54) BUBBLE AND META-STABILITY ERROR IMMUNE GRAY-CODE ENCODER FOR HIGH-SPEED A/D CONVERTERS

(75) Inventor: Jungwook Yang, West Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/643,956

(22) Filed: Aug. 23, 2000

(51) Int. Cl.[7] ................................................. H03M 1/36
(52) U.S. Cl. ..................... 341/159; 341/160; 341/155; 341/156; 341/158; 341/59; 341/97
(58) Field of Search ............................. 341/94, 97, 98, 341/159, 160

(56) References Cited

U.S. PATENT DOCUMENTS

| 4,644,322 A | * | 2/1987 | Fujita | 340/347 |
| 4,733,220 A | | 3/1988 | Knierim | 341/64 |
| 4,884,075 A | * | 11/1989 | Mangelsdorf | 341/159 |
| 5,072,221 A | * | 12/1991 | Schmidt | 341/159 |
| 5,633,636 A | * | 5/1997 | Reyhani | 341/97 |
| 5,644,312 A | * | 7/1997 | Deevy et al. | 341/160 |
| 6,034,630 A | * | 3/2000 | Komatsu et al. | 341/159 |
| 6,091,353 A | * | 7/2000 | Ariel et al. | 341/159 |

OTHER PUBLICATIONS

Portmann, et al., "Power–Efficient Metastability Error Reduction in CMOS Flash A/D Converters", IEEE Journal of Solid–State Circuits, vol. 31, No. 8, Aug. 1996, pp. 1132–1140.

Ono, et al., "Error Suppressing Encode Logic of FCDL in a 6–b Flash A/D Converter", IEEE Journal of Solid–State Circuits, vol. 32, No. 9, Sep. 1997, pp. 1460–1464.

Bernhard Zojer, et al., "A 6–Bit/200–MHz Full Nyquist A/D Converter", IEEE Journal of Solid–State Circuits, vol. sc–20, No. 3, Jun. 1985, pp. 780–786.

* cited by examiner

Primary Examiner—Michael Tokar
Assistant Examiner—Lam T. Mai
(74) Attorney, Agent, or Firm—Paul J. Otterstedt, Esq.; McGinn & Gibb, PLLC

(57) ABSTRACT

An encoding circuit for use with a comparator, includes a plurality of logic elements for receiving an input from a comparator, and a Gray code encoder for receiving an output from the plurality of logic elements. Both first and second type comparator errors (e.g., meta-stability errors and bubble-errors) are substantially eliminated simultaneously by the logic elements.

20 Claims, 7 Drawing Sheets

| COMP # | BUBBLE CASE 1 | | | | | | | | | | | | | | |
|---|---|---|---|---|---|---|---|---|---|---|---|---|---|---|---|
| 15 | 0 | 0 | 0 | 0 | 0 | 0 | 0 | 0 | 0 | 0 | 0 | 0 | 0 | 0 | 1 |
| 14 | 0 | 0 | 0 | 0 | 0 | 0 | 0 | 0 | 0 | 0 | 0 | 0 | 0 | 1 | 0 |
| 13 | 0 | 0 | 0 | 0 | 0 | 0 | 0 | 0 | 0 | 0 | 0 | 0 | 1 | 0 | 1 |
| 12 | 0 | 0 | 0 | 0 | 0 | 0 | 0 | 0 | 0 | 0 | 0 | 1 | 0 | 1 | 1 |
| 11 | 0 | 0 | 0 | 0 | 0 | 0 | 0 | 0 | 0 | 0 | 1 | 0 | 1 | 1 | 1 |
| 10 | 0 | 0 | 0 | 0 | 0 | 0 | 0 | 0 | 0 | 1 | 0 | 1 | 1 | 1 | 1 |
| 9 | 0 | 0 | 0 | 0 | 0 | 0 | 0 | 0 | 1 | 0 | 1 | 1 | 1 | 1 | 1 |
| 8 | 0 | 0 | 0 | 0 | 0 | 0 | 0 | 1 | 0 | 1 | 1 | 1 | 1 | 1 | 1 |
| 7 | 0 | 0 | 0 | 0 | 0 | 0 | 1 | 0 | 1 | 1 | 1 | 1 | 1 | 1 | 1 |
| 6 | 0 | 0 | 0 | 0 | 0 | 1 | 0 | 1 | 1 | 1 | 1 | 1 | 1 | 1 | 1 |
| 5 | 0 | 0 | 0 | 0 | 1 | 0 | 1 | 1 | 1 | 1 | 1 | 1 | 1 | 1 | 1 |
| 4 | 0 | 0 | 0 | 1 | 0 | 1 | 1 | 1 | 1 | 1 | 1 | 1 | 1 | 1 | 1 |
| 3 | 0 | 0 | 1 | 0 | 1 | 1 | 1 | 1 | 1 | 1 | 1 | 1 | 1 | 1 | 1 |
| 2 | 0 | 1 | 0 | 1 | 1 | 1 | 1 | 1 | 1 | 1 | 1 | 1 | 1 | 1 | 1 |
| 1 | 1 | 0 | 1 | 1 | 1 | 1 | 1 | 1 | 1 | 1 | 1 | 1 | 1 | 1 | 1 |
| BEST GUESS | 1 | 2 | 3 | 4 | 5 | 6 | 7 | 8 | 9 | 10 | 11 | 12 | 13 | 14 | 15 |
| ENCODER OUTPUT | 1 | 3 | 0 | 5 | 2 | 7 | 4 | 9 | 6 | 11 | 8 | 13 | 10 | 15 | 12 |
| ERROR | 0 | 1 | -3 | 1 | -3 | 1 | -3 | 1 | -3 | 1 | -3 | 1 | -3 | 1 | -3 |

| COMP # | BUBBLE CASE 1 | | | | | | | | | | | | | | |
|---|---|---|---|---|---|---|---|---|---|---|---|---|---|---|---|
| 15 | 0 | 0 | 0 | 0 | 0 | 0 | 0 | 0 | 0 | 0 | 0 | 0 | 0 | 0 | 1 |
| 14 | 0 | 0 | 0 | 0 | 0 | 0 | 0 | 0 | 0 | 0 | 0 | 0 | 0 | 1 | 0 |
| 13 | 0 | 0 | 0 | 0 | 0 | 0 | 0 | 0 | 0 | 0 | 0 | 0 | 1 | 0 | 1 |
| 12 | 0 | 0 | 0 | 0 | 0 | 0 | 0 | 0 | 0 | 0 | 0 | 1 | 0 | 1 | 1 |
| 11 | 0 | 0 | 0 | 0 | 0 | 0 | 0 | 0 | 0 | 0 | 1 | 0 | 1 | 1 | 1 |
| 10 | 0 | 0 | 0 | 0 | 0 | 0 | 0 | 0 | 0 | 1 | 0 | 1 | 1 | 1 | 1 |
| 9 | 0 | 0 | 0 | 0 | 0 | 0 | 0 | 0 | 1 | 0 | 1 | 1 | 1 | 1 | 1 |
| 8 | 0 | 0 | 0 | 0 | 0 | 0 | 0 | 1 | 0 | 1 | 1 | 1 | 1 | 1 | 1 |
| 7 | 0 | 0 | 0 | 0 | 0 | 0 | 1 | 0 | 1 | 1 | 1 | 1 | 1 | 1 | 1 |
| 6 | 0 | 0 | 0 | 0 | 0 | 1 | 0 | 1 | 1 | 1 | 1 | 1 | 1 | 1 | 1 |
| 5 | 0 | 0 | 0 | 0 | 1 | 0 | 1 | 1 | 1 | 1 | 1 | 1 | 1 | 1 | 1 |
| 4 | 0 | 0 | 0 | 1 | 0 | 1 | 1 | 1 | 1 | 1 | 1 | 1 | 1 | 1 | 1 |
| 3 | 0 | 0 | 1 | 0 | 1 | 1 | 1 | 1 | 1 | 1 | 1 | 1 | 1 | 1 | 1 |
| 2 | 0 | 1 | 0 | 1 | 1 | 1 | 1 | 1 | 1 | 1 | 1 | 1 | 1 | 1 | 1 |
| 1 | 1 | 0 | 1 | 1 | 1 | 1 | 1 | 1 | 1 | 1 | 1 | 1 | 1 | 1 | 1 |
| BEST GUESS | 1 | 2 | 3 | 4 | 5 | 6 | 7 | 8 | 9 | 10 | 11 | 12 | 13 | 14 | 15 |
| INVENTION | 1 | 2 | 3 | 4 | 5 | 6 | 7 | 8 | 9 | 10 | 11 | 12 | 13 | 14 | 15 |
| ERROR | 0 | 0 | 0 | 0 | 0 | 0 | 0 | 0 | 0 | 0 | 0 | 0 | 0 | 0 | 0 |

BUBBLE AND META-STABILITY ERROR IMMUNE GRAY-CODE ENCODER FOR HIGH-SPEED A/D CONVERTERS

BACKGROUND OF THE INVENTION

1. Field of the Invention

The present invention generally relates to an encoding circuit, and more particularly to a bubble error and meta-stability error immune gray-code encoder for high-speed analog-to-digital (A/D) converters.

2. Description of the Related Art

High-speed analog-to-digital converters (ADCs) encounter two typical problems. A first problem is the meta-stability in comparators resulting in output errors, which is due to the relatively small difference in the input of the comparators and not enough time to amplify the small input difference to the large logic levels.

That is, metastability errors occur in A/D converters when undefined comparator outputs pass through an encoder to the converter output bits. In flash converters, $2^n-1$ comparators are presented with a voltage different $V_{REF(i)}-V_A$ and latched every clock cycle. Under normal operating conditions, the comparator outputs generate a "thermometer code," where comparators with reference voltages above $V_A$ have an output of "0" and the rest of the comparators have an output of "1". Thermometer code detection logic turns on the appropriate word line in the encode ROM. However, if $V_A$ is near the reference voltage for a comparator, the comparator output may be undefined at the end of the valuation time. Since $V_A$ typically has a continuous amplitude, there is always a finite probability that the voltage difference cannot be amplified sufficiently in the time allotted for comparison. If the output is not sufficiently amplified, indeterminate digital signals are propagated to the encoder logic, thereby leading to errors.

Thus, metastability errors result in invalid or metastable logic states which may cause logical errors in the encoding circuit, thereby producing an output code not representative of the input voltage applied to the A/D converter.

Another problem is the so-called bubble error, which is due to the non-monotonic output code generated from the comparator array.

Referring to FIG. 1, a conventional binary code encoder 10 is shown which can reduce the bubble errors. In operation, the comparator outputs $t_i$ form a thermometer code in the normal operation, which is . . . 000111 . . . and a logic circuit (e.g., including NAND gates 11 and transistors 12) detects 0–1 transition out of the bit pattern, and converts it into a so-called 1-of-n code, which appears as . . . 0001000 . . . However, if a bubble error is introduced in the thermometer code, there can be two (or more) 1–0 transition points in the code, for example, . . . 00010111 . . . The logic circuit in FIG. 1 detects a 011 pattern instead of a 01 pattern so that it can eliminate the effect due to the bubble error. The converted 1-of-n code is converted to a binary code in the binary encoding ROM composed of transistors 12 as shown in FIG. 1. However, this conventional encoder cannot reduce the meta-stability related errors (e.g., see K. Ono., et al., "Error Suppressing Encode Logic of FCDL in a 6-b Flash A/D Converter," IEEE Journal of Solid-State Circuits, Vol. 32, pp. 1460–1464, September 1997), because the metastable signal can propagate to the more significant bit (MSB), thereby resulting in a large output digital error (e.g., a so-called "meta-stability error"), as shown in FIG. 2.

Meta-stability errors can be reduced by having more pipe-lined comparator stages to increase the regeneration time and gain (e.g., see B. Zojer, R. Petschacher, and W. A. Luschning, "A 6-bit/200-MHz full Nyquist A/D converter," IEEE J. Solid-State Circuits, Vol. SC-20, No. 3, pp. 780–786, June 1985). However, this configuration will increase the latency, power consumption, and also the area of the ADC, as the number of pipelined stages is increased.

A gray code encoding scheme can be employed to reduce the meta-stability errors. There are some examples of gray code encoders (e.g., see Ono et al. mentioned above and U.S. Pat. No. 4,733,220 to Knierim et al.) that can reduce the meta-stability related errors.

Typically, ADCs incorporating such gray code encoders are for converting an analog voltage signal to an n-bit (e.g., four-bit) Gray code signal of equivalent magnitude. The ADC typically includes an analog-to-thermometer code converter, a thermometer-to-Gray encoder and a set of latches coupling the output of the code converter to the input of the encoder.

The Gray code is a well known non-weighted, adjacent binary code, wherein only one bit is changed to increment or decrement the value of a number represented by the code. The analog-to-thermometer code conversion circuit typically includes a set of comparators and a voltage divider network. An analog voltage signal to be sampled is applied to a non-inverting input of one of the comparators while a reference voltage VREF is applied to the voltage divider network, thereby producing progressively lower reference voltage quantum levels applied to inverting inputs of each comparator. Each comparator includes a different amplifier having an output which saturates to a high (e.g., logical "1") comparator output state if the input voltage is sufficiently higher than its voltage reference level, or saturates to a low (e.g., "0") comparator output state if the input voltage is sufficiently closer than its reference voltage.

Thus, the comparators produce outputs $t_1-t_N$, which collectively appears as N-bit thermometer code representing the magnitude of the input voltage as any of N+1 discrete number including 0. The outputs $t_1-t_N$ are in turn latched into the input of the encoding circuit on receipt of a clock signal, and then the encoder converts the thermometer code to the more compact and useful Gray code. The conventional encoder includes AND gates providing an input to an OR gate (e.g., 4 OR gates producing a 4-bit Gray code).

However, such gray code encoding schemes are very susceptible to bubble errors.

For purposes of the present invention, a "bubble error" is defined as an error occurring as a result of hardware mismatches in which the threshold of a comparator is designed to be linear, but in reality there are errors such as clock errors resulting in the different sampling time among the comparators, offset voltage in the comparators resulting in the change of threshold voltage, etc. Thus, in normal operation, when a comparator with a higher threshold gives a "1" at an output, then another comparator having a lower threshold should also provide an output of "1". However, with any type of error, the lower threshold comparator may provide at its output, a "0" instead of a "1". Thus, errors (e.g., so-called bubble errors) in the gray code encoder may cause a faulty output and operation of the system.

Thus, the output codes with the bubble errors in the comparator array may cause digital output errors. Typical ADCs using binary code encoder can be implemented with a bubble correction circuit that observes a few of the comparator outputs at once to detect the location of the bubble and suppresses it as in Ono et al.

However, prior to the present invention, there have been few, if any, acceptable gray encoding schemes for solving both bubble errors and meta-stability errors.

For example, Portmann et al. (e.g., C. L. Portmann, T. H. Y. Meng, "Power-Efficient Metastability Error Reduction in CMOS Flash A/D Converters," IEEE J. Solid-State Circuits, Vol. 31, No. 8, pp. 1132–1140, August. 1996) uses a gray encoding scheme that can both reduce the bubble errors as well as the meta-stability error. However, due to the additional stage of a "completion detection circuit" required in the encoder, the operating speed is reduced and additional circuit "real estate" is required.

Thus, hitherto the invention, there have been no acceptable schemes for solving both bubble errors and meta-stability errors, without reducing an operating speed and efficiency of the system.

That is, as the conversion rate and the resolution of the ADC go higher, it has more problems of meta-stability in the comparator array because the time to amplify and regenerate the input signal becomes shorter as the speed becomes higher and the input signal difference is smaller.

However, if a comparator has a meta-stable output, the binary code encoder will generate a digital output error as large as half the full scale in the worst case.

Gray code changes only in one digit as the code increases or decreases by one. Gray code encoding using this characteristic can remove the error resulting from meta-stability (e.g., see Ono et al. and U.S. Pat. No. 4,733,220).

FIG. 1 shows a conventional meta-stability error-immune gray-code encoder in U.S. Pat. No. 4,733,220. However, as mentioned above, the conventional encoder lacks the ability to suppress the error due to bubble errors, as shown in FIG. 2.

SUMMARY OF THE INVENTION

In view of the foregoing and other problems, disadvantages, and drawbacks of the conventional methods and structures, an object of the present invention is to provide a new gray encoding scheme (and encoder) that can solve the bubble errors as well as the meta-stability-related errors without significantly reducing the operating speed.

In a first aspect of the present invention, an encoding circuit for use with a comparator, includes a plurality of logic elements for receiving an input from a comparator, and a Gray code encoder for receiving an output from the plurality of logic elements, wherein first and second type of errors (e.g., both meta-stability errors and bubble-errors) in the input from the comparator are substantially eliminated simultaneously by the plurality of logic elements.

With the unique and unobvious features of the present invention, a gray-code encoder is provided that can suppress both the meta-stability and bubble errors without significantly (if at all) affecting the operating speed of the system.

Thus, as the conversion speed and the resolution of the ADC go higher, the present invention will not encounter more problems of meta-stability in the comparator array because the time to amplify and regenerate the input signal becomes shorter as the speed goes high and the input signal difference is smaller.

Further, the invention will correct errors due to the bubble codes in the comparator array. As mentioned above, typical ADCs using a binary code have a bubble correction circuit as shown in FIG. 1, which "sees" a few of the comparator outputs at once to detect the location of the bubble and suppresses it. However, if a comparator has a meta-stable output, the binary code encoder will generate a digital output error as big as half the full scale in the worst case, as shown in FIG. 2. This is because one comparator output error can affect more than one output bit, and the error in the MSB bits will cause a large error in the binary number system. The unique structure of the invention remedies such problems.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
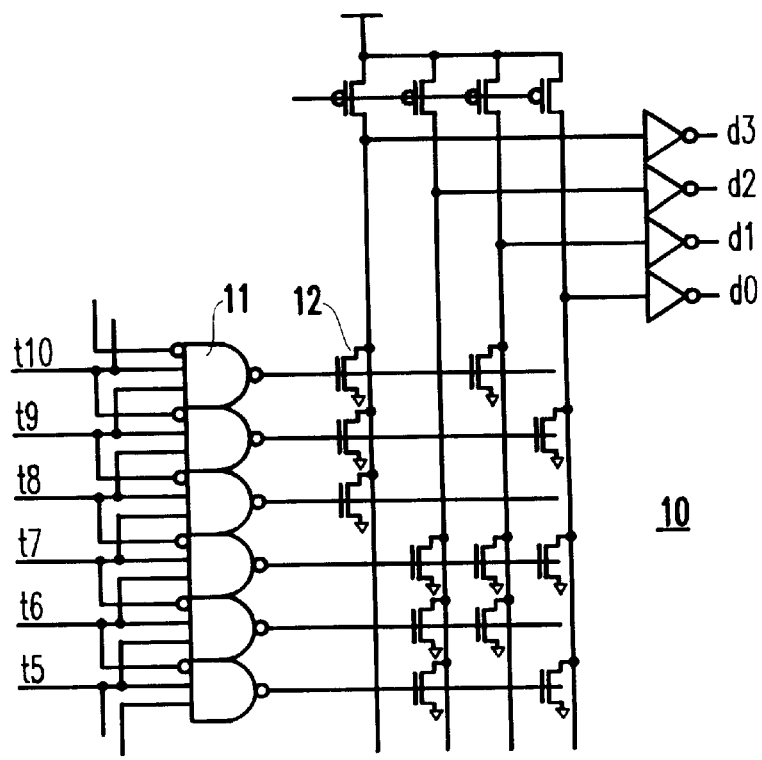
FIG. 1 illustrates a conventional binary code encoder 10.
Figure 2:
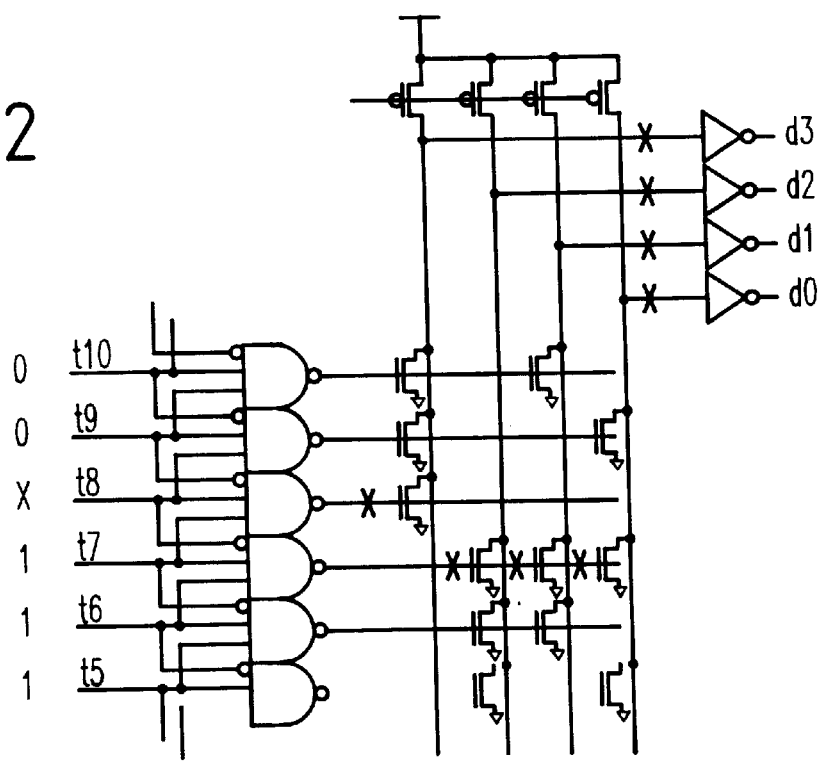
FIG. 2 illustrates a digital output error caused by meta-stability in the comparator in the circuit 10 of FIG. 1.

Referring now to the drawings, and more particularly to FIGS. 6–8 and 10, there are shown preferred embodiments of the method and structures according to the present invention.

FIRST PREFERRED EMBODIMENT

Figure 3:
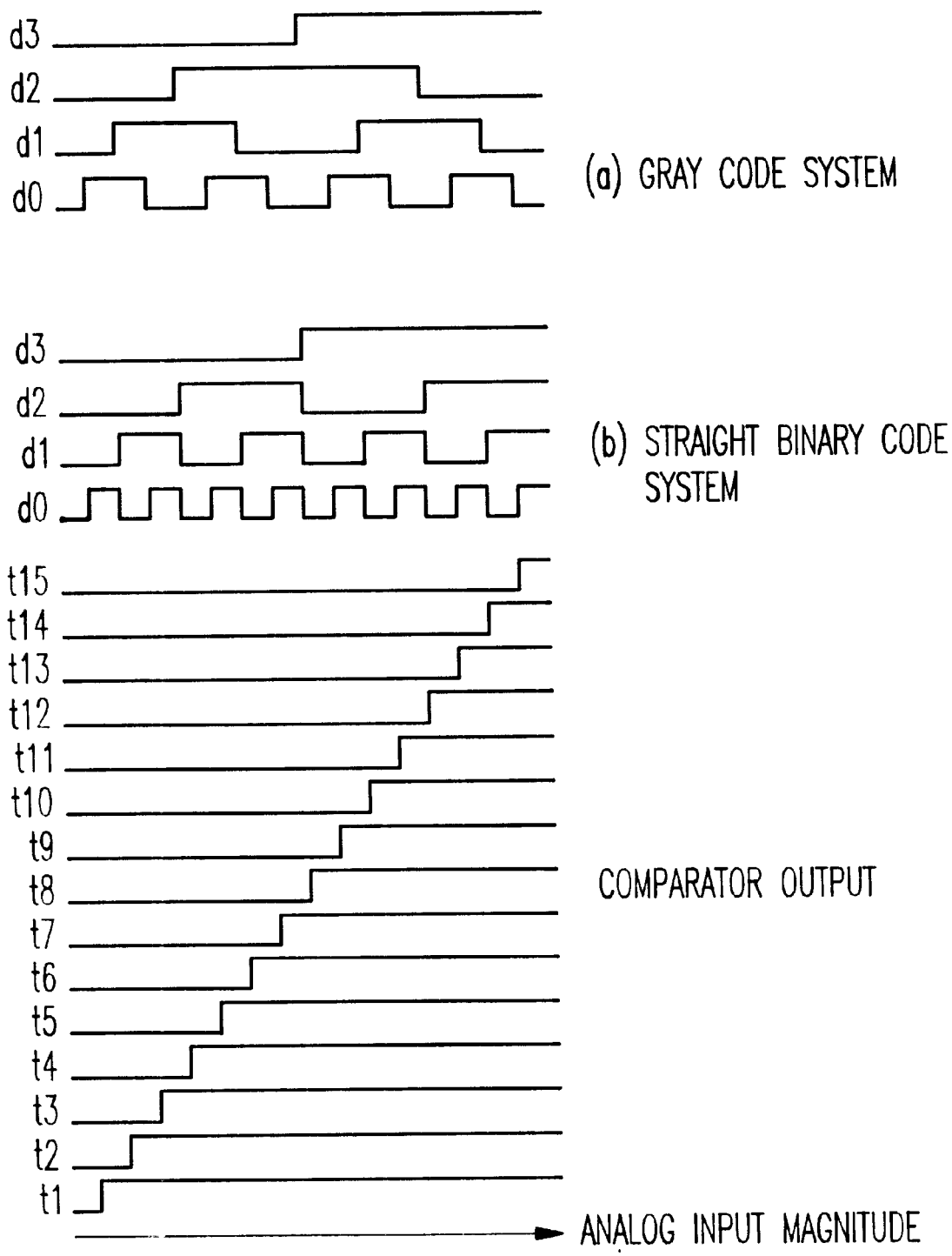
FIG. 3 illustrates an output of a Gray code encoder corresponding to the comparator output.

First, before turning to the structure of the preferred embodiment, it is noted that FIG. 3 illustrates a comparison of the 4-bit straight binary code and gray code systems corresponding to the comparator output.

In the flash A/D converter system, the comparator output makes a so-called "thermometer code", which is 00 . . . 00111 . . . 11 corresponding to the analog input signal.

For example, when t8 changes in FIG. 3, all four bits (e.g., d0–d3) in the straight binary code system change. If t8 has a meta-stable output, all four bits (e.g., d0–d3) can be affected and become uncertain. Thus, the possible output code can range from 0000 (decimal 0) to 1111 (decimal 15), while the actual value should be 0111 (decimal 7) or 1000 (decimal 8). In this case, the maximum error is 7.5.

As opposed to the straight binary code, gray code changes only in one digit as the code increases or decreases by one (1), as shown in FIG. 3. When t8 changes in FIG. 3, only the MSB bit d3 changes. If t8 has a meta-stable output, only the MSB bit will be affected, while the other bits stay stable. In this case, the possible output code can be either 0100 (decimal 7) or 1100 (decimal 8). In this case, the maximum error is only 0.5, which means the output code is correct. Gray code encoding using this characteristic can remove the error resulting from meta-stability (e.g., see Ono et al. and U.S. Pat. No. 4,733,220).

On the other hand, the binary code encoder 10 in FIG. 1 can suppress the bubble errors. The three-input AND gate in FIG. 1 gives "1" at the output when it detects 011 at the input, and "0" otherwise. When there is a bubble error at the comparator outputs such as 0000000101111111 (t15 . . . t1), the AND gate array will give 000000001000000, which will be converted to 0111 (decimal 7) in the encoder.

Figures 4, 5:
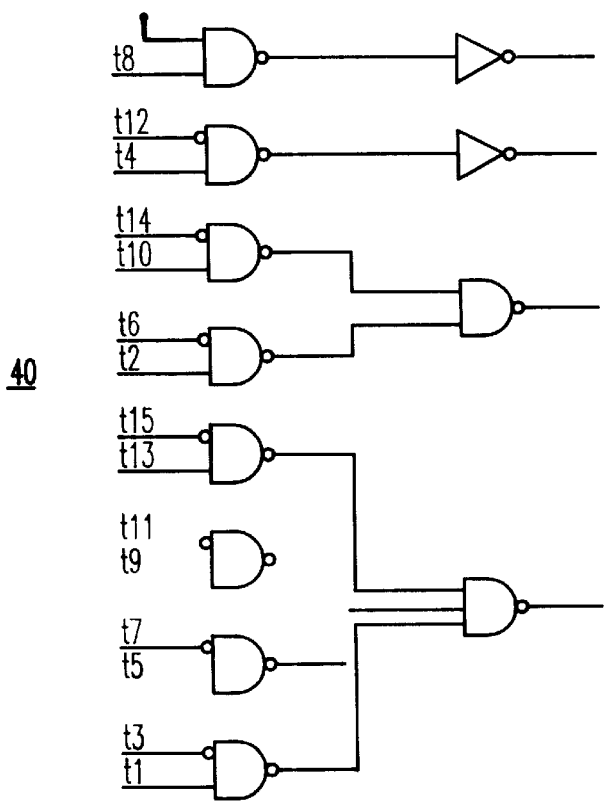
FIG. 4 illustrates a conventional Gray code encoder 40.
FIG. 5 illustrates a result of the outputs of the conventional Gray code encoder 40 in which bubble errors appear in the gray encoding for the 4-bit case.

FIG. 4 shows the gray-code encoder 40 in U.S. Pat. No. 4,733,220, which is meta-stability error-immune, as described above. The logic circuit is configured such that the gray code outputs can toggle as the thermometer code of the comparator outputs changes.

For example, when t1 is 1 while others are 0, only d0 becomes 1. t2 is connected to the logic circuits for d1 such that t2 can toggle d1 as shown in FIG. 3, and so forth. However, this encoding scheme lacks the ability to suppress the error due to bubble errors because this circuit 40 assumes that the comparator output is always a thermometer code. If there is a bubble error in the comparator output, this encoder 40 can have a large error at the digital output (d3–d0), as shown in FIG. 5.

Figures 6, 7:
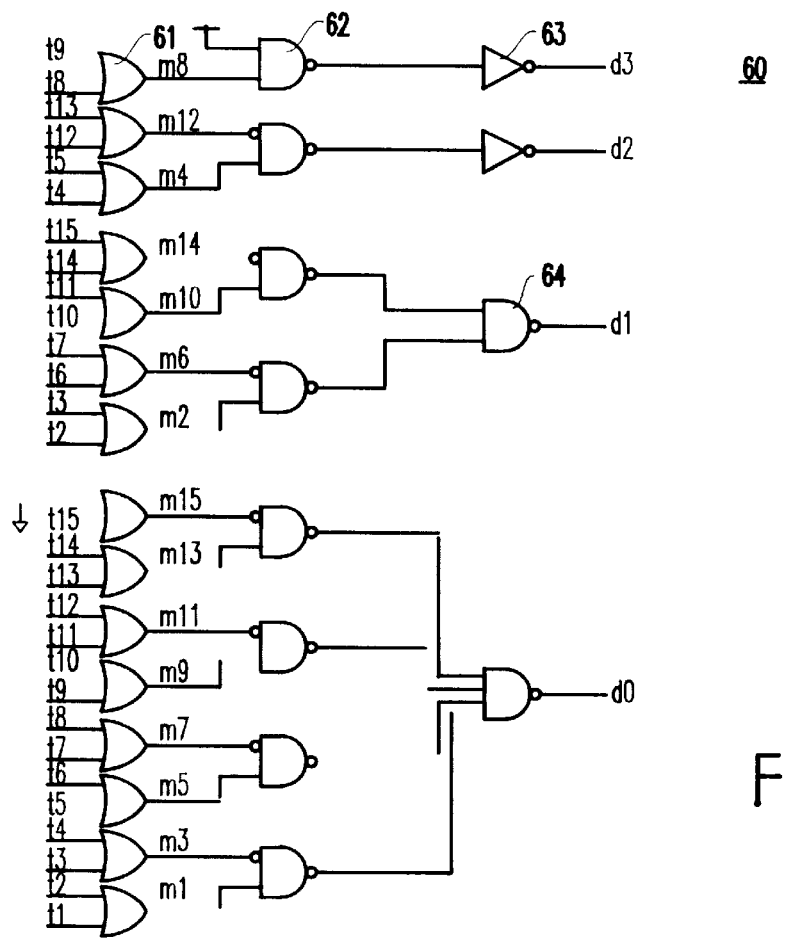
FIG. 6 illustrates a bubble-error correcting Gray code encoder 60 according to the present invention.
FIG. 7 illustrates a result of the output of the Gray code encoder 60 of FIG. 6 when bubbles occur.

Referring now to FIG. 6, the present invention provides a gray-code encoder 60 that can suppress both the meta-stability errors and bubble errors.

The encoder 60 includes a plurality of OR gates 61, a plurality of NAND gates 62, inverters 63 and NAND gates 64.

A unique feature of the present invention is that the additional OR gates 61 (e.g., on the left of FIG. 6) replace the "0" in the bubble error of the comparator output with a "1", so that the outputs of the OR gates 61 become a thermometer code, which is required in the gray code encoder 40 in FIG. 4. The invention simultaneously solves the bubble error and metastability errors by providing a configuration in which it is assured that the outputs of the OR gates 61 receiving the comparator inputs (e.g., t1 to t15 become a thermometer code. Such a thermometer code can be advantageously used by a gray code encoder to simultaneously remove the metastability errors.

In operation, the additional OR gate 61 does not change the characteristic of the circuit of FIG. 4 to suppress the metastability error because the outputs of the OR gates 61 transfer the metastable input to only one metastable output in m1–m15 if there is any. For example, suppose that input analog signal of the A/D converter is such that the thermometer code transitions around t7 and t8, and assume that t7 is metastable. m7 can be metastable because m7 results from an OR operation of t7 and t8, which is mostly logic "0" with the given analog input signal. However, m6 is logic "1" because t6 is mostly logic "1".

Thus, these additional OR gates 61 still keep the meta-stability immune characteristic, because the meta-stable output can still affect only one digital output in d3–d0, and yet the bubble errors are simultaneously removed since a gray code encoder is being employed.

FIG. 7 shows the digital output code when the bubbles occur. As shown here, the output of the Gray encoder 60 in FIG. 6 corrects the bubble error.

SECOND PREFERRED EMBODIMENT

Figure 8:
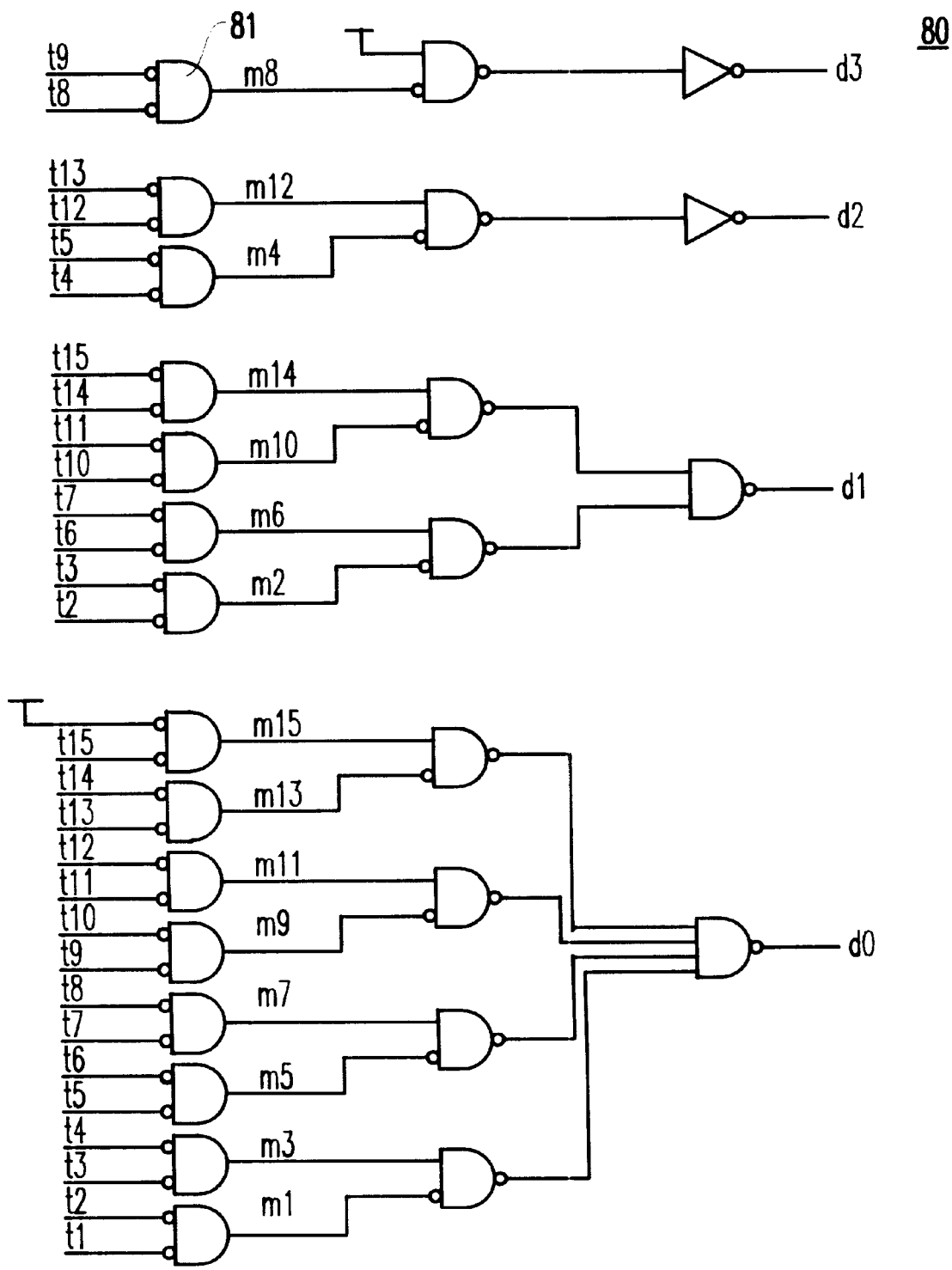
FIG. 8 illustrates another embodiment of a bubble-corrected Gray code encoder 80 according to the present invention (e.g., having AND gates instead of the OR gate configuration of FIG. 6)

As shown in FIG. 8, in a second embodiment (which is a modification of the first embodiment of the present invention), the OR gates 61 of FIG. 6 can be replaced with AND gates 81 by appropriately reconfiguring the logic as shown in FIG. 8.

In operation, the OR gate 61 in FIG. 6 is replaced with the AND gate 81 in FIG. 8 with appropriate boolean operation. For example, d2 in FIG. 6 is $$d2 = (\overline{t13} + \overline{t12}) \; X \; (t5 + t4)$$

$$= (\overline{t13} \; X \; \overline{t12}) \; X \; (\overline{t5 \; X \; t4})$$

where + is the boolean OR operation and X is the boolean AND operation. By the nature of the boolean operation, the OR gate can be replaced with an AND gate with appropriate inversion of the input and output signals, as shown in FIG. 8.

The advantages of the structure of FIG. 8 over that of FIG. 6 include that the NAND gate (AND and NOT) operation can be faster than OR or NOR gate in some of the logic families, especially in CMOS logic, and the first inversion of the comparator output t1–t15 comes free from the comparator output as most of the comparator implementation is differential.

The circuit 60 in FIG. 6 can be expanded to fix the comparator output with multiple bubbles (i.e., 00001001111).

That is, here, three input OR gates 61 can be used to suppress bubble errors with two zeros introduced in the thermometer code. Conceptually, bubble errors with more zeros can be corrected with OR gates with more inputs.

Figure 9:
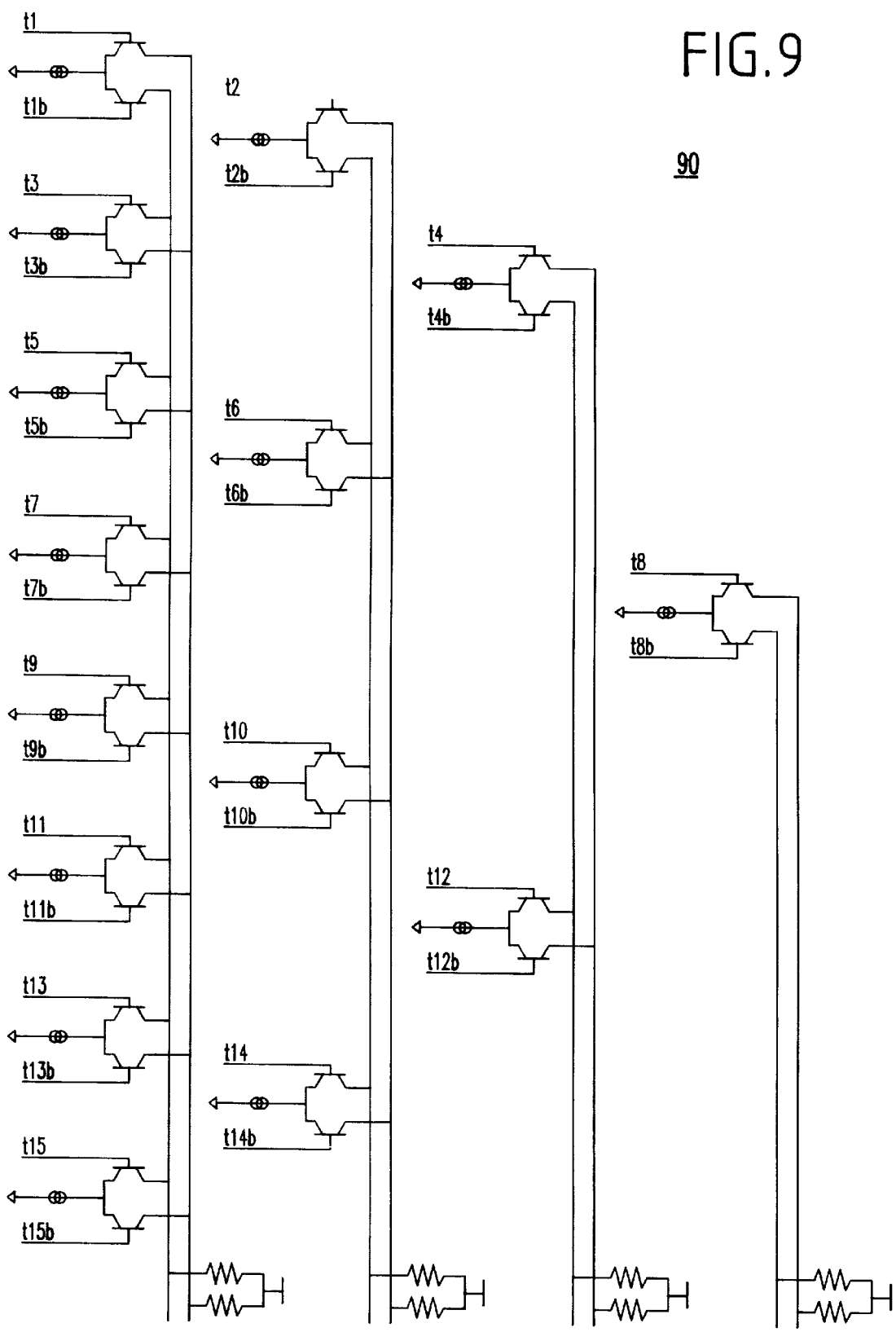
FIG. 9 illustrates a conventional bubble-error correcting bipolar gray-code encoder 90.

This technique is applicable to the FCDL (folded-cascode differential logic) gray-code encoding (e.g., see the above-mentioned Ono et al.), which is a conventional bipolar gray-code encoder as shown in FIG. 9.

Figure 10:
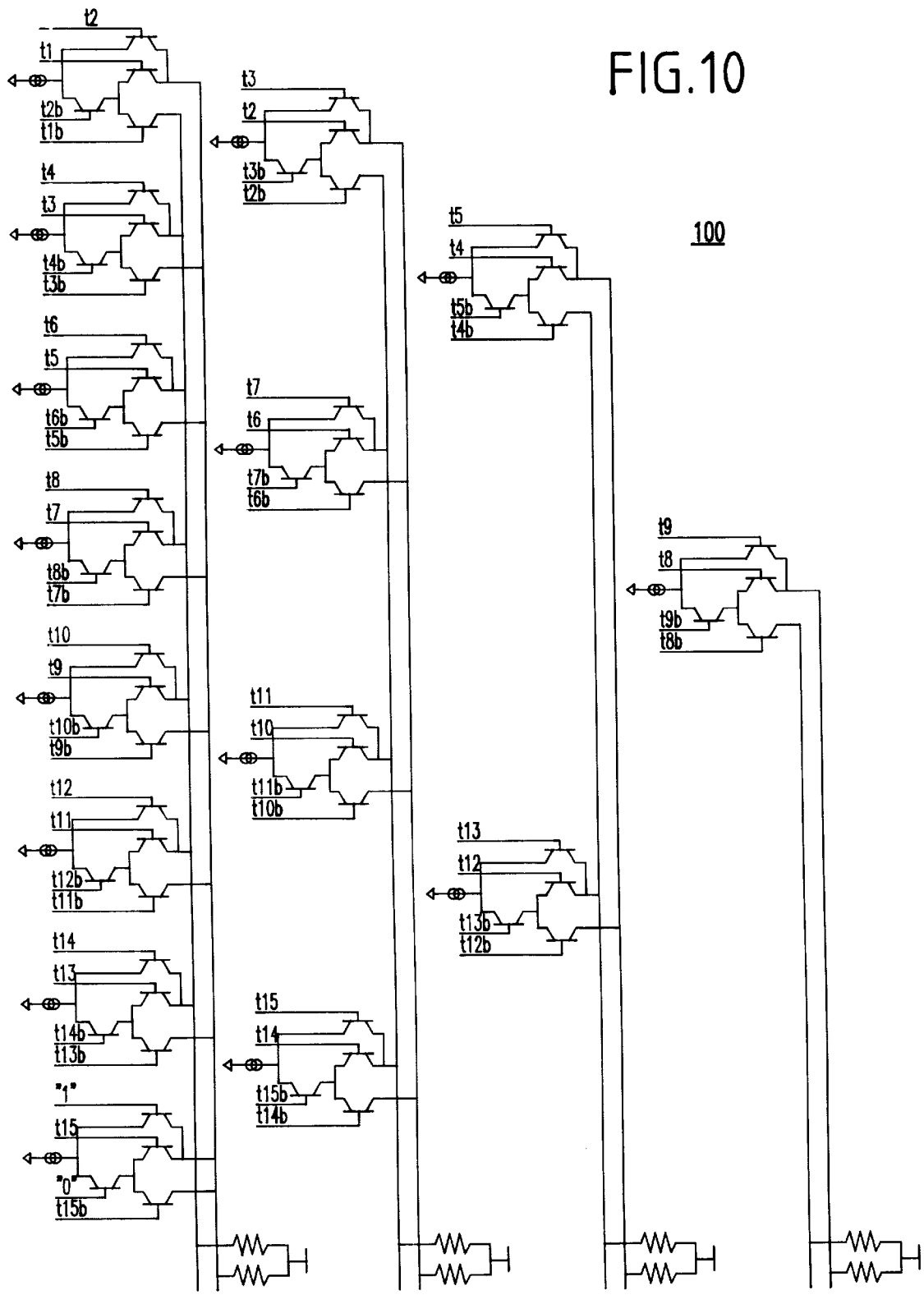
FIG. 10 illustrates a bubble-error correcting bipolar gray-code encoder 100 according to the present invention.

The OR gates are implemented in the bipolar emitter-coupled logic structure 100 according to the invention, as shown in FIG. 10. For example, the OR gate 61 in FIG. 6 is implemented with inputs of t8, t13, t9b, and t13b at the rightmost in FIG. 10. This is how the OR gates are implemented in emitter-coupled logic (ECL), and the detailed operation of ECL OR gate (and transistor operation) is believed to be well-known to one of ordinary skill in the art, and for brevity, such will not be further described herein. As is clear to one skilled in the art, the AND gates can be implemented in the bipolar technology of FIG. 10. Further, OR gates with three or more inputs can be implemented to suppress the two or more consecutive bubble errors in the thermometer code as described before.

Thus, with the unique and unobvious features of the invention, a circuit is provided which simultaneously solves (eliminates) both bubble errors and meta-stability errors, without significantly (if at all) reducing an operating speed and efficiency of the system.

While preferred embodiments of the present invention have been described above, it should be understood that it has been provided as an example only. Thus, those skilled in the art will recognize that the invention can be practiced with modification within the spirit and scope of the appended claims.

For example, the circuit in FIG. 10 can be implemented with devices other than bipolar transistors. That is, a CMOS transistor implementation is feasible.

What is claimed is:

1. An encoding circuit for use with a comparator, comprising:

a plurality of logic elements for receiving an input from a comparator; and a Gray code encoder for receiving an output from said plurality of logic elements, wherein first and second type comparator errors in-said input from said comparator are substantially eliminated simultaneously by said logic elements.

2. The circuit of claim 1, wherein said first and second type comparator errors comprise meta-stability errors and bubble-errors.

3. The circuit of claim 1, wherein said logic elements comprise OR gates.

4. The circuit of claim 1, wherein said logic elements comprise AND gates.

5. The circuit of claim 1, wherein said circuit is implemented in complementary metal oxide semiconductor (CMOS) technology.

6. The circuit of claim 1, wherein said circuit is implemented in bipolar technology.

7. The circuit of claim 1, wherein said Gray code encoder includes a plurality of second logic elements and a plurality of third logic elements for receiving respectively an output from said second logic elements.

8. The circuit of claim 7, wherein said second logic elements comprise NAND gates and said third logic elements comprise inverters.

9. The circuit of claim 1, wherein said logic elements replace a "0" in a bubble error of the comparator output with a "1", such that the outputs of the logic elements become a thermometer code.

10. The circuit of claim 1, wherein said logic elements eliminate meta-stability errors in the input from the comparator, such that a meta-stable output affects only one digital output of said comparator.

11. The circuit of claim 1, wherein said logic elements comprise three input OR gates for suppressing bubble errors with two zeros inserted in a thermometer code.

12. The circuit of claim 1, wherein said OR gates include a plurality of inputs for correcting bubble errors with more zeros.

13. The circuit of claim 1, wherein said encoder comprises a folded-cascode differential logic (FCDL) gray-code encoder.

14. An encoding circuit, comprising:

a comparator;

a plurality of logic elements for receiving an input from said comparator; and a Gray code encoder for receiving an output from said plurality of logic elements,
wherein first and second type comparator errors in said input from said comparator are substantially eliminated simultaneously by said logic elements.

15. The circuit of claim 14, wherein said first and second type comparator errors comprise meta-stability errors and bubble-errors.

16. The circuit of claim 14, wherein said logic elements comprise OR gates.

17. The circuit of claim 14, wherein said logic elements comprise AND gates.

18. The circuit of claim 14, wherein said circuit is implemented in complementary metal oxide semiconductor (CMOS) technology.

19. The circuit of claim 14, wherein said circuit is implemented in bipolar technology.

20. A bubble-error-correcting Gray code encoder, comprising:

a plurality of first logic elements for receiving an input from a comparator and providing an output; and a plurality of second logic element s for receiving an output from said plurality of first logic elements,
wherein both meta-stability errors and bubble-errors in said input from said comparator are eliminated simultaneously by said first logic elements.

* * * * *